(12) United States Patent
Hatsui et al.

(10) Patent No.: US 12,501,727 B2
(45) Date of Patent: Dec. 16, 2025

(54) LIGHT-RECEIVING ELEMENT, X-RAY IMAGING ELEMENT, AND ELECTRONIC APPARATUS

(71) Applicants: RIKEN, Saitama (JP); SONY SEMICONDUCTOR SOLUTIONS CORPORATION, Kanagawa (JP)

(72) Inventors: Takaki Hatsui, Saitama (JP); Takahiro Kawamura, Kanagawa (JP); Hiroki Tojinbara, Kanagawa (JP)

(73) Assignees: Sony Semiconductor Solutions Corporation, Kanagawa (JP); Riken, Saitama (JP)

( * ) Notice: Subject to any disclaimer, the term of this patent is extended or adjusted under 35 U.S.C. 154(b) by 190 days.

(21) Appl. No.: 18/285,456

(22) PCT Filed: Mar. 25, 2022

(86) PCT No.: PCT/JP2022/014356
§ 371 (c)(1),
(2) Date: Oct. 3, 2023

(87) PCT Pub. No.: WO2022/230498
PCT Pub. Date: Nov. 3, 2022

(65) Prior Publication Data
US 2024/0186340 A1 Jun. 6, 2024

(30) Foreign Application Priority Data
Apr. 28, 2021 (JP) .................................. 2021-075730

(51) Int. Cl.
*G01T 1/00* (2006.01)
*G01T 1/24* (2006.01)
(Continued)

(52) U.S. Cl.
CPC ............. *H10F 39/802* (2025.01); *G01T 1/24* (2013.01); *H10F 39/1892* (2025.01)

(58) Field of Classification Search
CPC ......... G01T 1/24; G01T 1/241; H10F 39/189; H10F 39/1892; H10F 39/80; H10F 30/221; H10F 39/107
See application file for complete search history.

(56) References Cited

U.S. PATENT DOCUMENTS

2007/0077725 A1\* 4/2007 Wilson ..................... H10D 8/50
257/E27.051
2018/0337204 A1 11/2018 Bakowski Holtryd et al.
(Continued)

FOREIGN PATENT DOCUMENTS

CN 109671799 A 4/2019
JP H114012 A 1/1999
(Continued)

OTHER PUBLICATIONS

Golshani Negin et al: "PureB multi-guard ring structures for detector applications",Microelectronic Engineering, vol. 160, Apr. 27, 2016 (Apr. 27, 2016), pp. 54-62, XP029521079.
(Continued)

*Primary Examiner* — Dani Fox
(74) *Attorney, Agent, or Firm* — K&L Gates LLP

(57) ABSTRACT

A light-receiving element according to an embodiment of the present disclosure includes: a semiconductor substrate (11) including a photoelectric conversion region; a first electrically-conductive region (13A) provided at an interface of one surface of the semiconductor substrate (11) and coupled to a first electrode (16); a second first electrically-conductive region (13B) provided at the interface of the one surface and around the first electrically-conductive region (13A) and coupled to a second electrode (17); and a third first electrically-conductive region (13C) provided at the
(Continued)

interface of the one surface and around the second first electrically-conductive region (13B) and being in an electrically floating state.

20 Claims, 10 Drawing Sheets

(51) Int. Cl.
*H10F 39/00* (2025.01)
*H10F 39/18* (2025.01)

(56) References Cited

U.S. PATENT DOCUMENTS

| 2019/0305159 | A1* | 10/2019 | Santangelo | H01L 21/74 |
| 2020/0006409 | A1 | 1/2020 | Bakowski Holtryd | |
| 2022/0262844 | A1 | 8/2022 | Bakowski Holtryd et al. | |

FOREIGN PATENT DOCUMENTS

| JP | 2020520102 A | 7/2020 |
| WO | 2020231304 A1 | 11/2020 |
| WO | WO2020231304 | * 11/2020 |

OTHER PUBLICATIONS

Safavi-Naeini M et al: "Evaluation of Silicon Detectors With Integrated JFET for Biomedical Applications", vol. 56, No. 3, Jun. 1, 2009 (Jun. 1, 2009), pp. 1051-1055, XP0112626.

International Search Report from corresponding PCT application PCT/JP2022/014356, dated May 31, 2022.

Segal, J. D. et al.; "A new structure for controlling dark current due to surface generation in drift detectors"; Nuclear Instruments and Methods in Physics Research A; 1998; vol. 414, pp. 307-316. (10 pages.).

* cited by examiner

[FIG. 1]
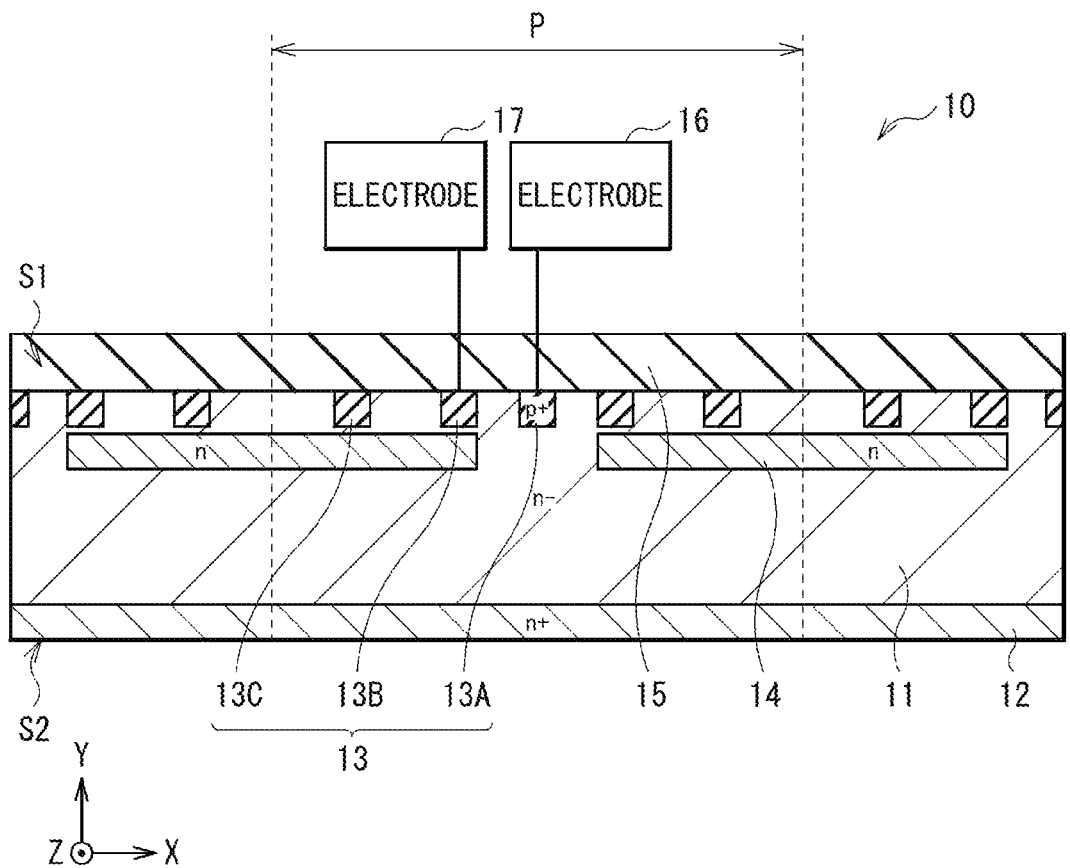
[FIG. 2]
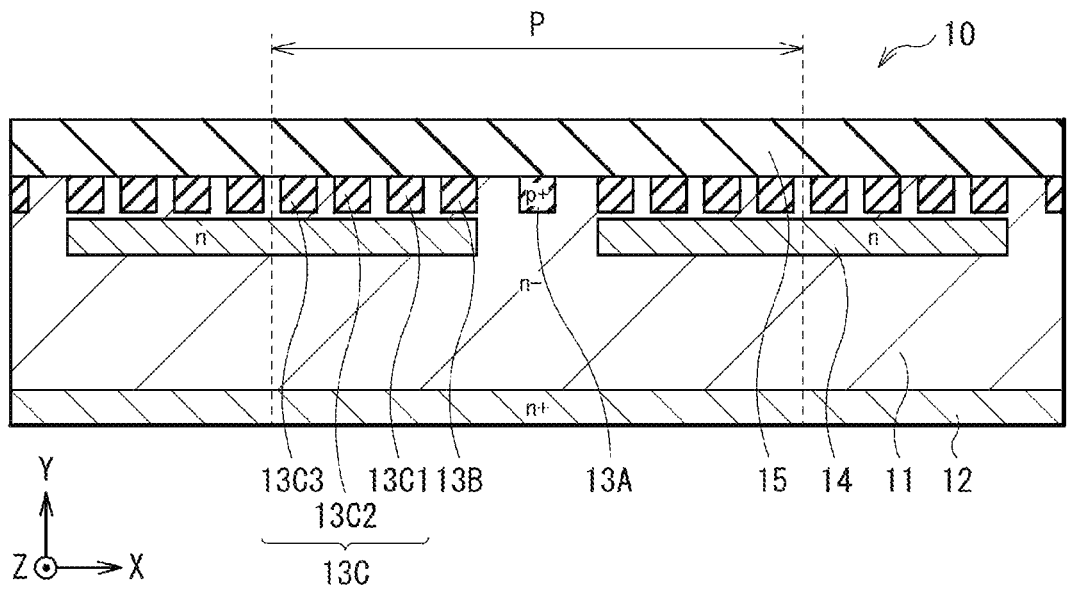

[ FIG. 3 ]
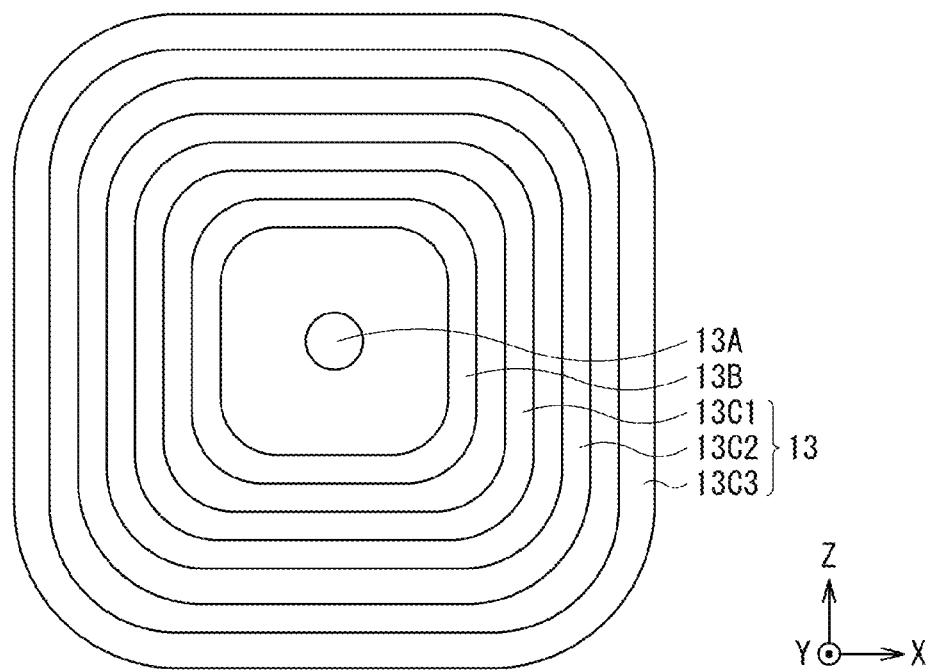
[ FIG. 4 ]
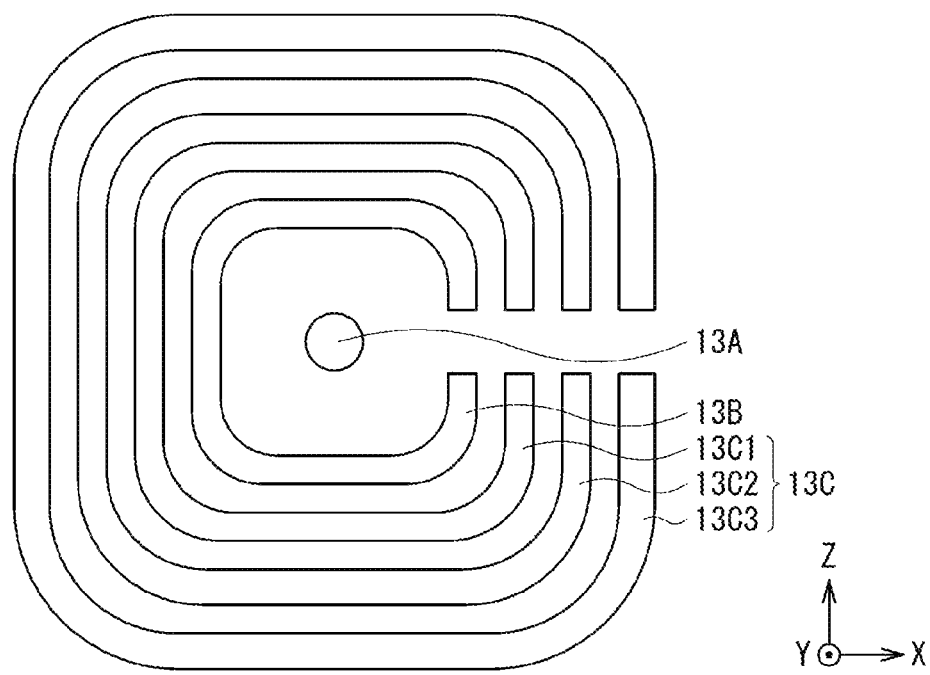

[FIG. 5]
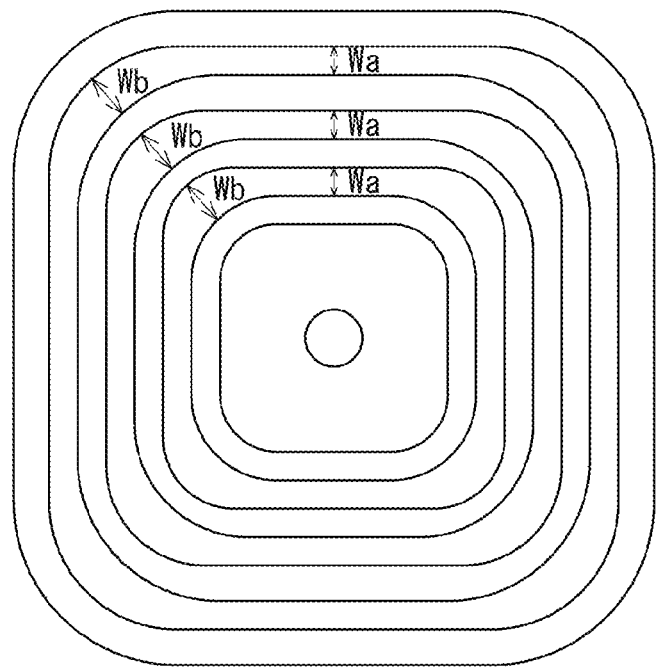

[ FIG. 6 ]
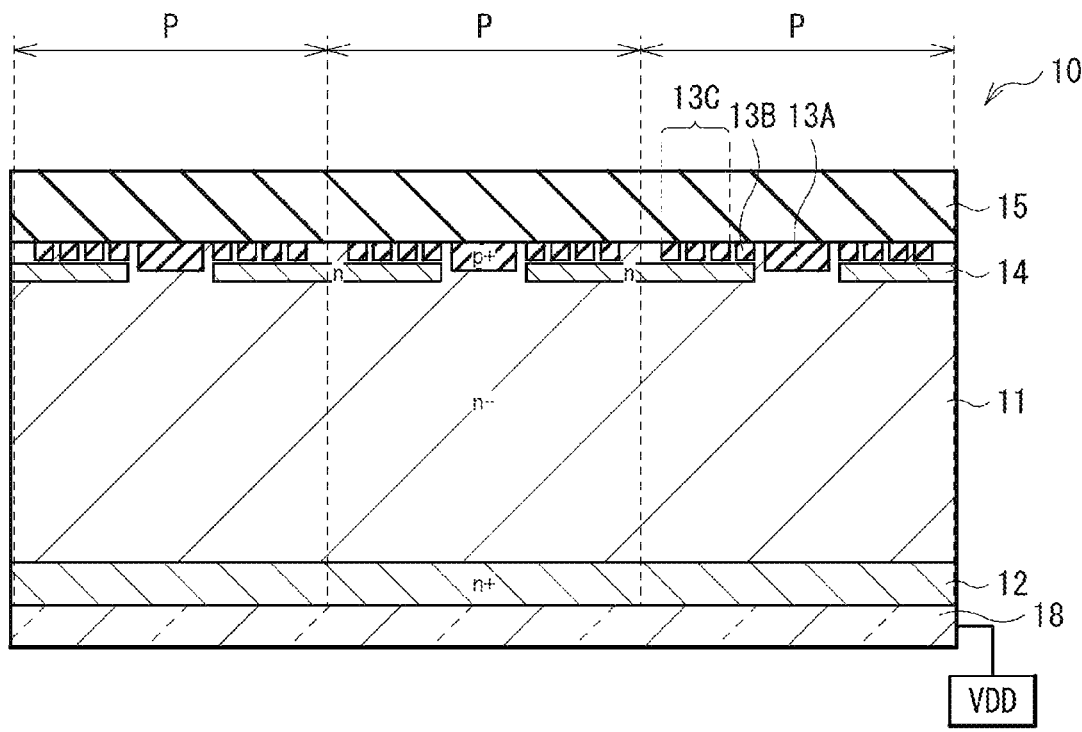
[ FIG. 7 ]
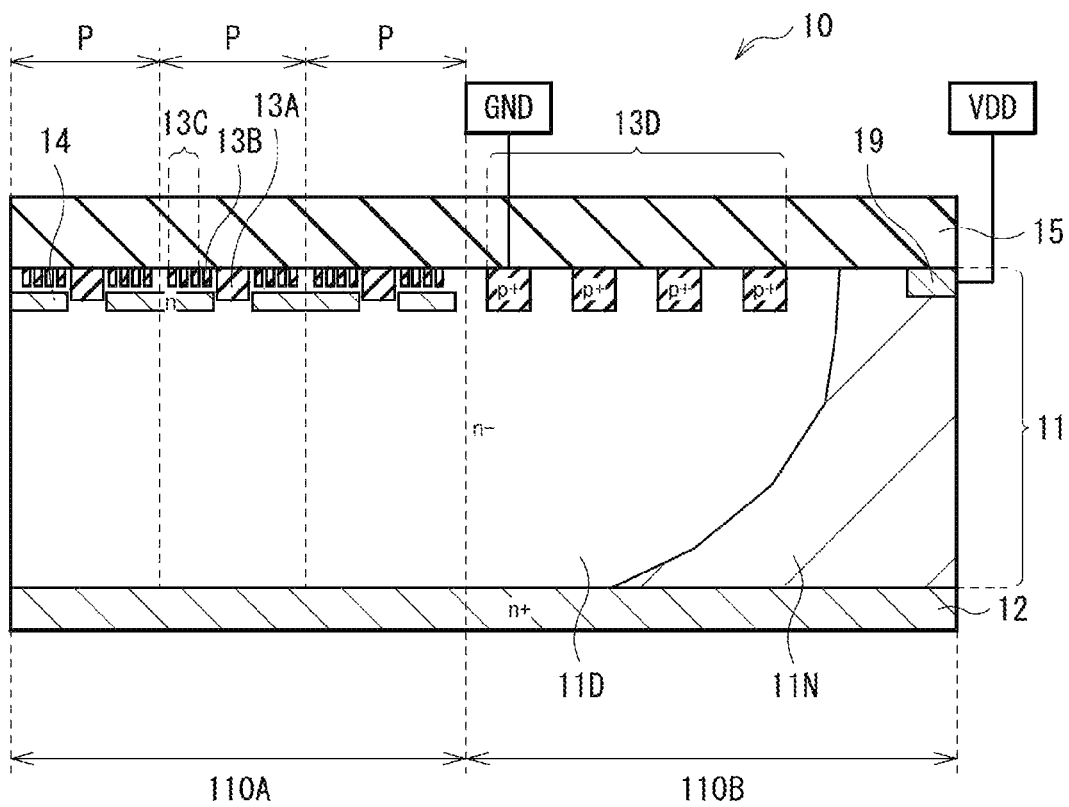

[ FIG. 8 ]
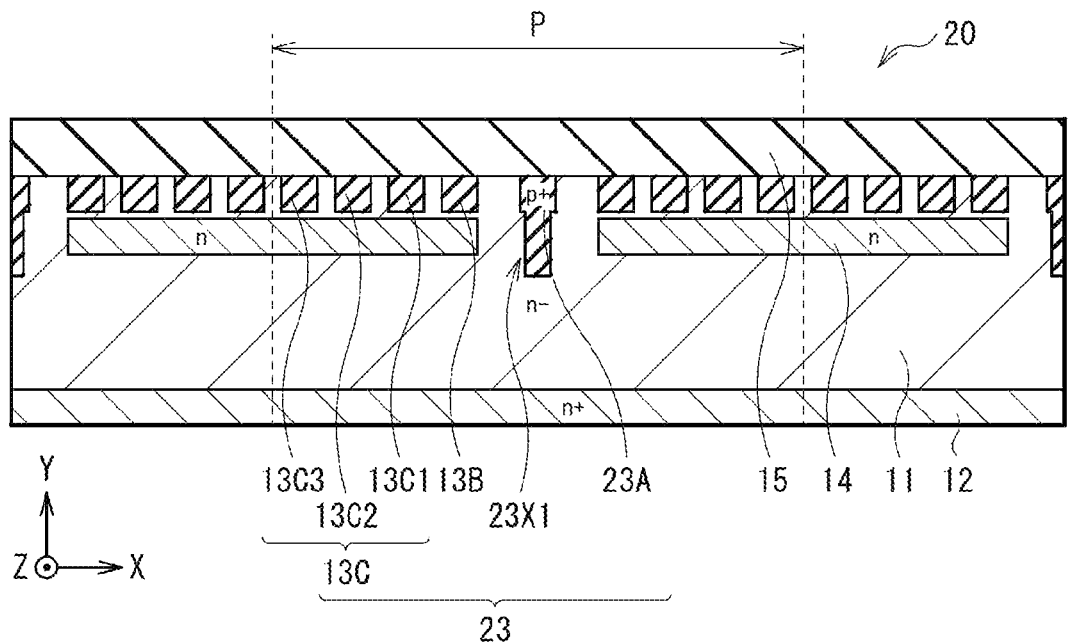
[ FIG. 9 ]
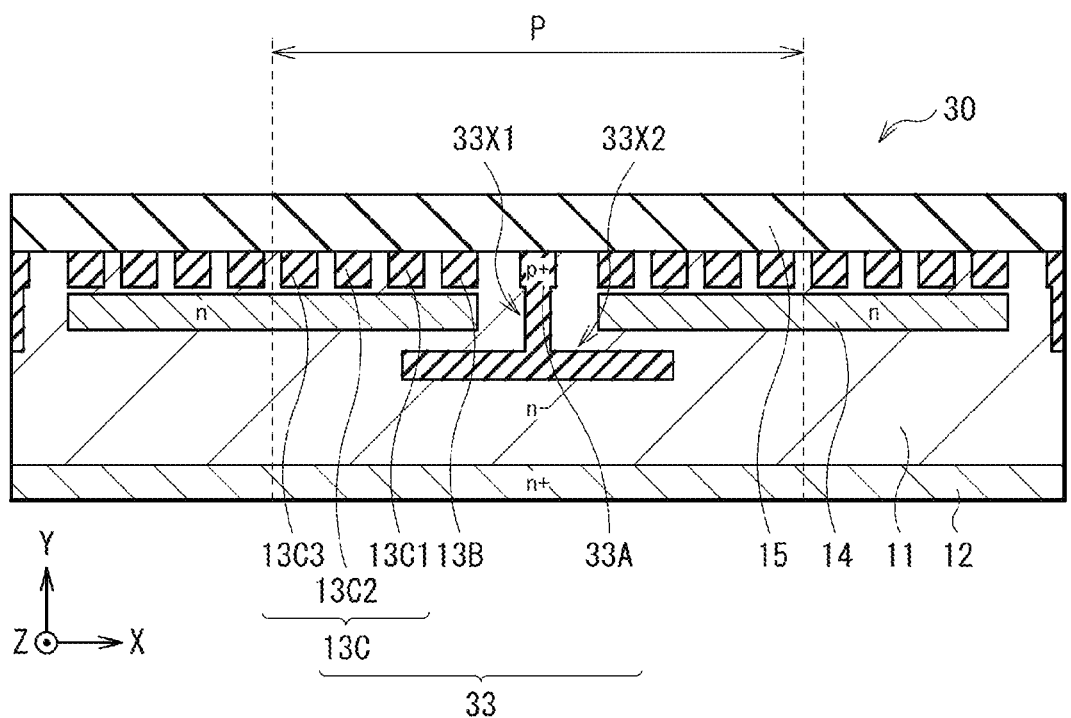

[ FIG. 10 ]
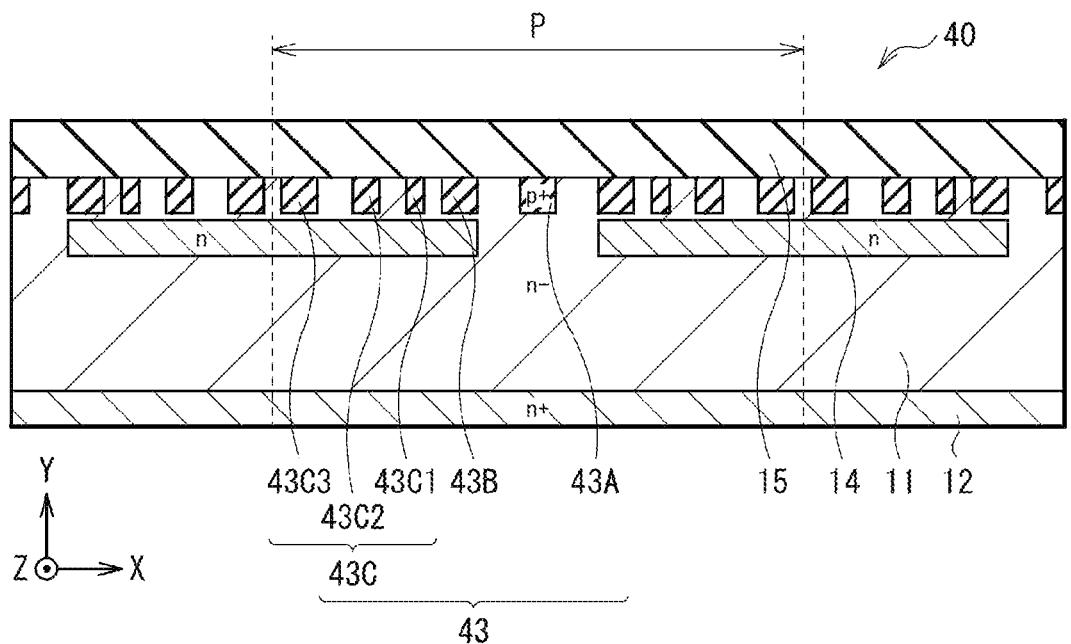
[ FIG. 11 ]
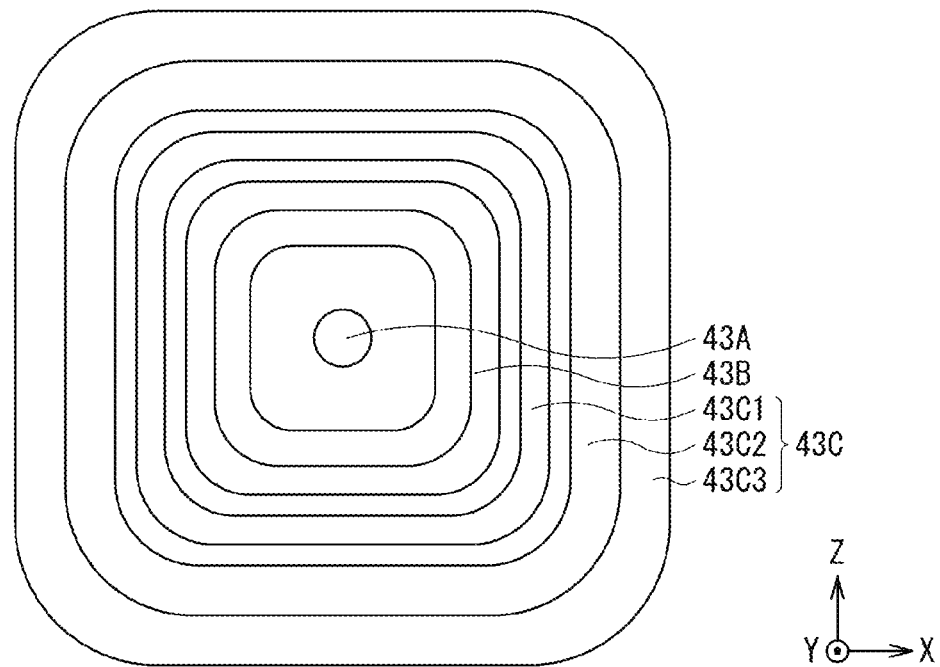

[ FIG. 12 ]
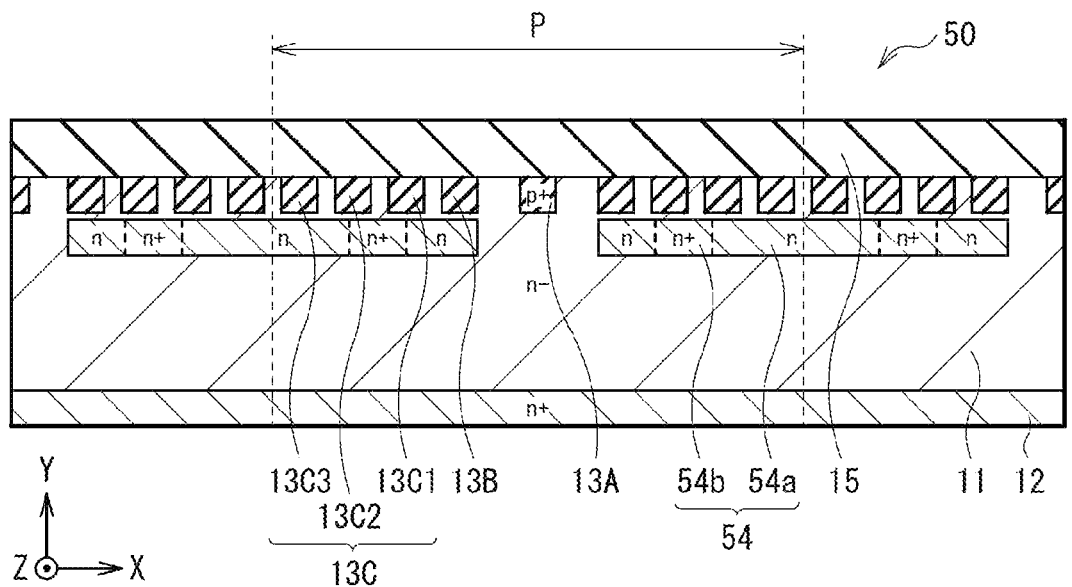
[ FIG. 13 ]
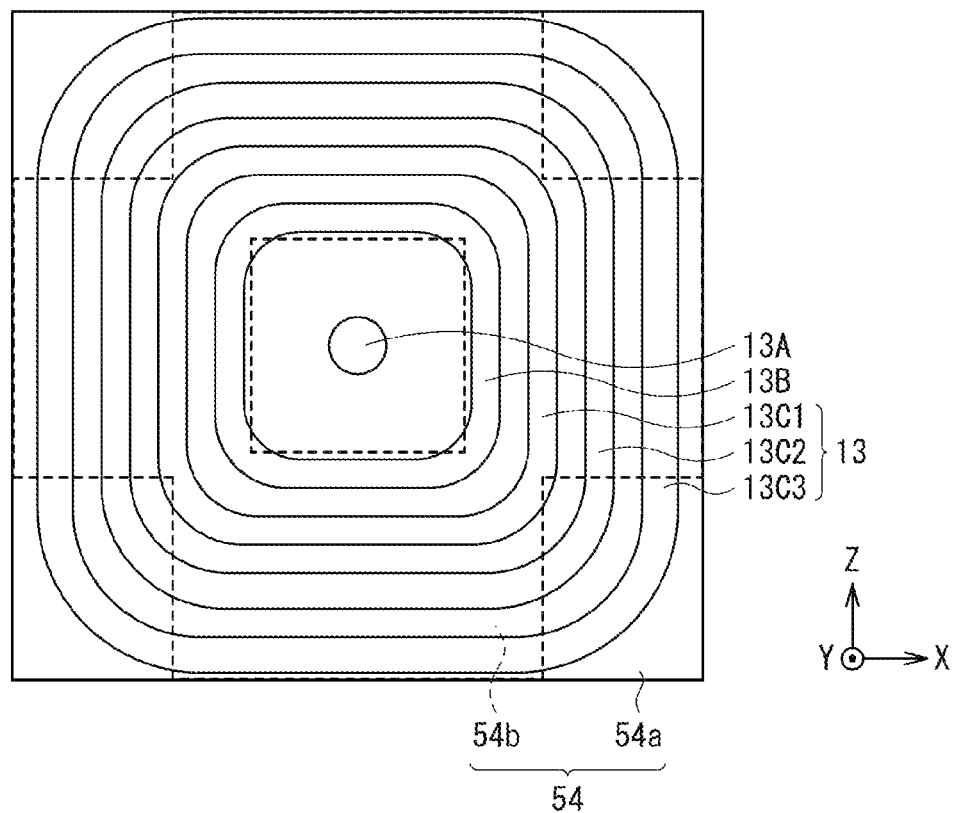

[ FIG. 14 ]
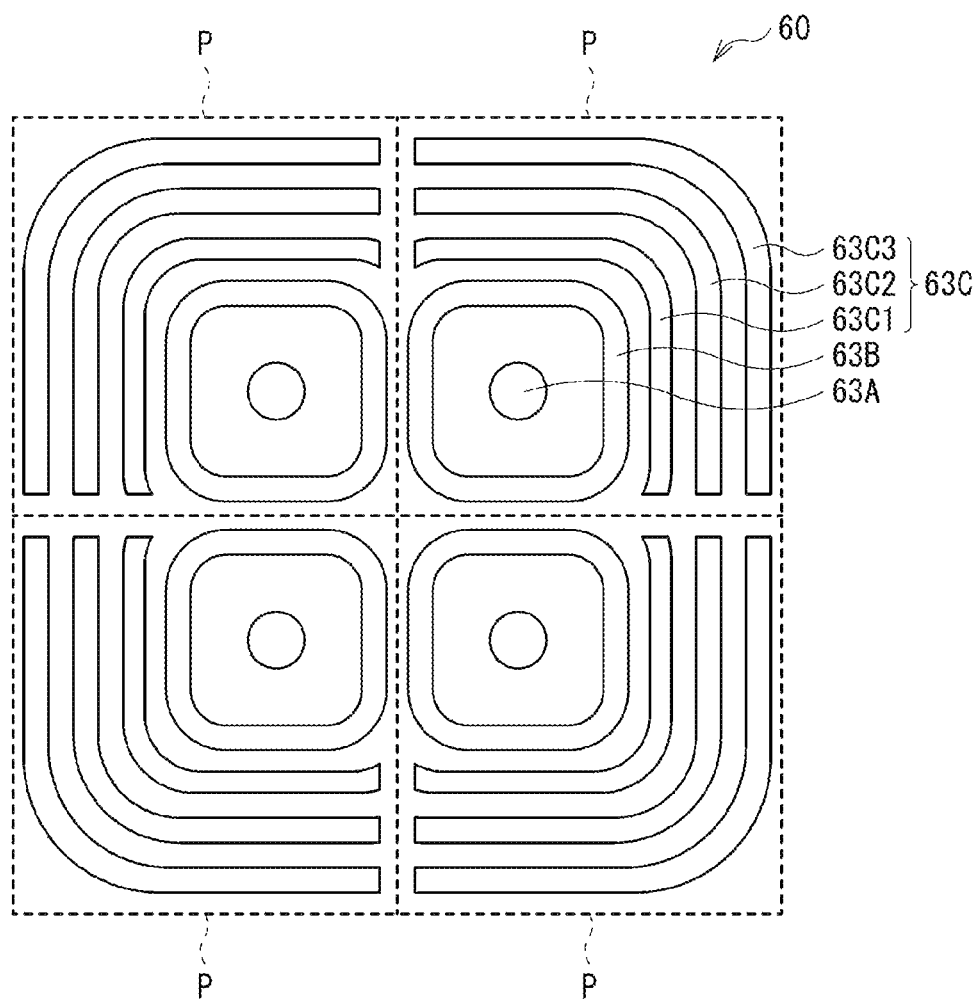

[ FIG. 15 ]
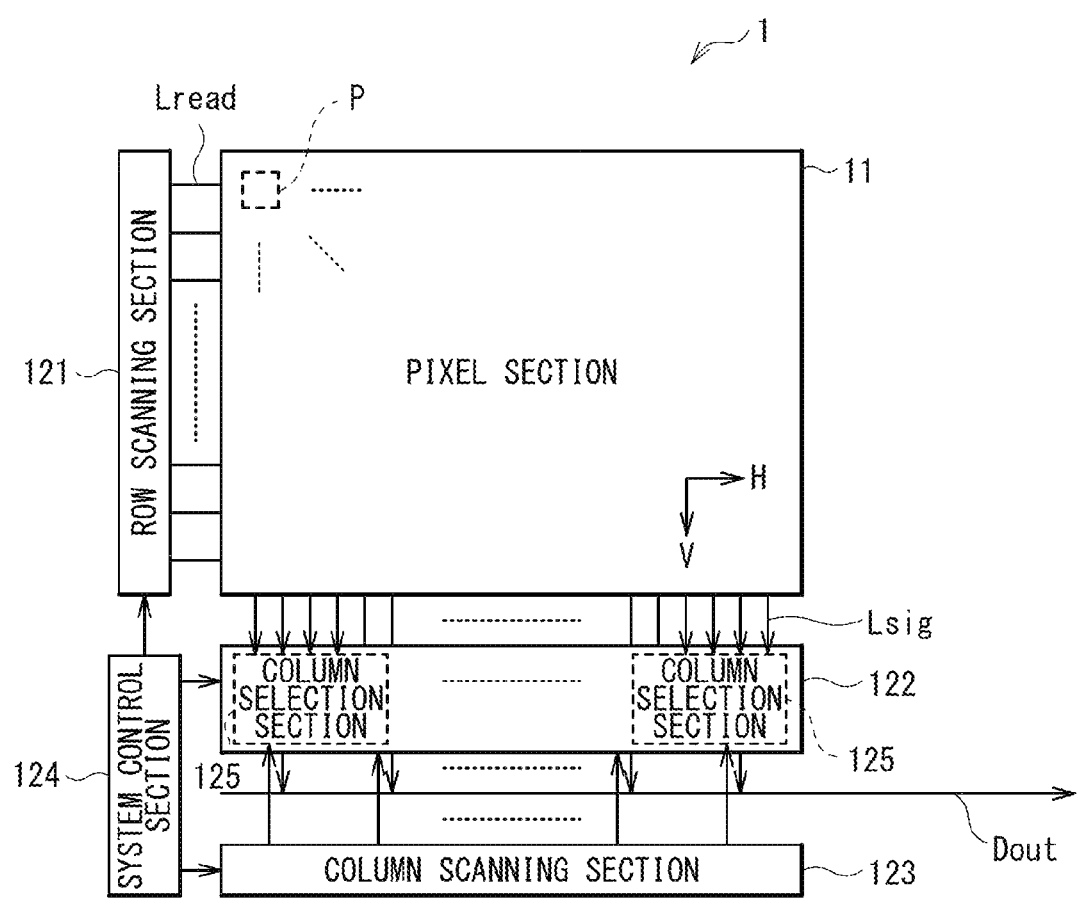

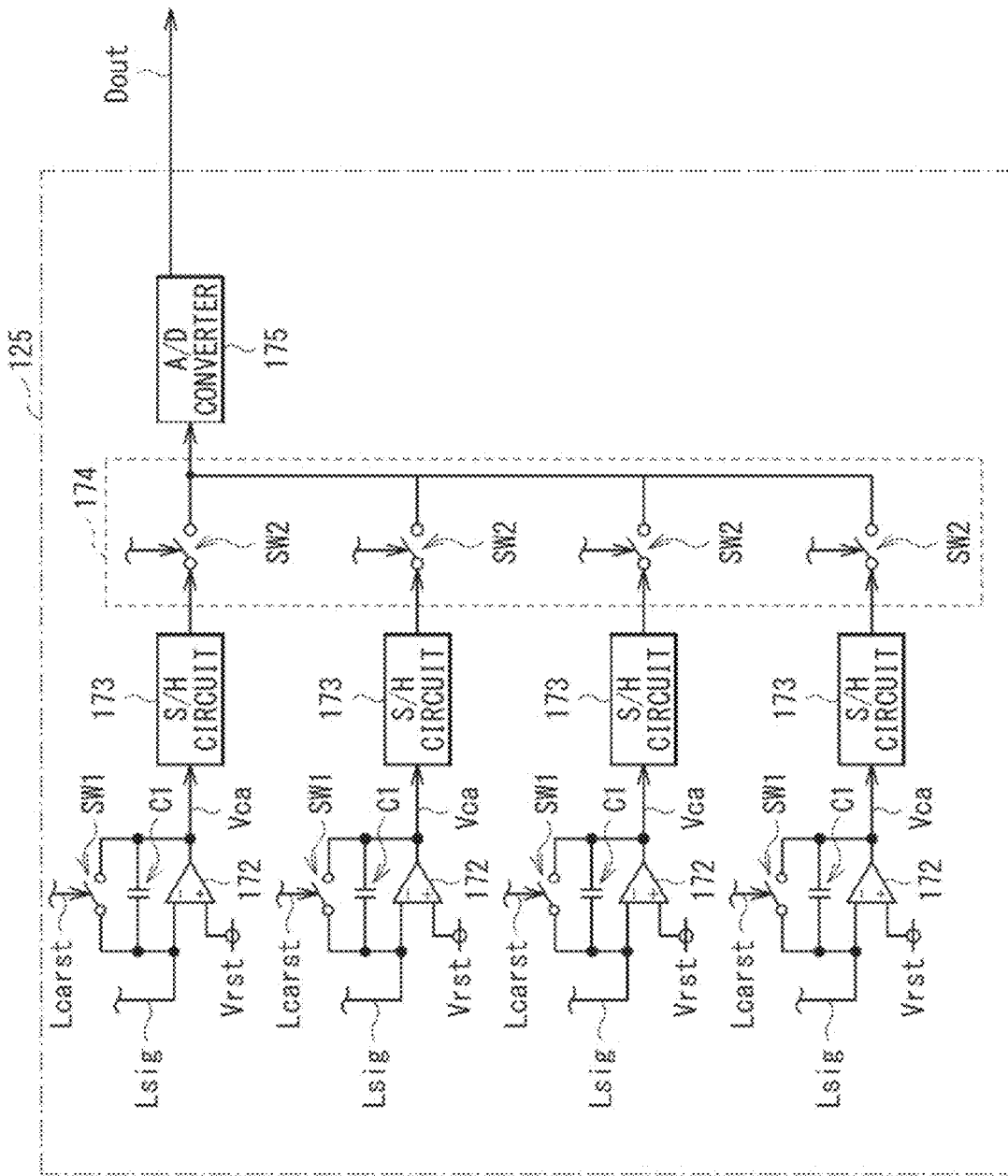
[FIG. 16]

LIGHT-RECEIVING ELEMENT, X-RAY IMAGING ELEMENT, AND ELECTRONIC APPARATUS

TECHNICAL FIELD

The present disclosure relates to a light-receiving element suitable for X-ray photography for medical application or non-destructive examination, for example, and an X-ray imaging element and an electronic apparatus including the light-receiving element.

BACKGROUND ART

Solid-state imaging devices are used in various applications including, for example, an imaging device such as a digital still camera or a video camera, an electronic apparatus such as a mobile terminal apparatus having an imaging function, or an electromagnetic wave sensor that detects various wavelengths other than that of visible light. Examples of the solid-state imaging devices include an APS (Active Pixel Sensor) including an amplifying element for each pixel; a CMOS (complementary MOS) image sensor (CIS) has been widely used that reads signal charge accumulated in a photodiode, as a photoelectric conversion element, via a MOS (Metal Oxide Semiconductor) transistor.

As a sensor for scientific use that requires high sensitivity measurement, a light-receiving element (PIN photodiode) has been used that has a structure in which a photoelectric conversion region and a floating diffusion region (Floating Diffusion; FD) are integrated (see, e.g., PTL 1). Such a light-receiving element is easy to be manufactured from a simple structure. In addition, any potential difference can be applied to a p-n junction that forms a photoelectric conversion region. This makes it easy to increase the thickness of the photoelectric conversion region.

CITATION LIST

Patent Literature

PTL 1: Japanese Unexamined Patent Application Publication No. H11-4012

SUMMARY OF THE INVENTION

Incidentally, in recent years, for a sensor for scientific use, an X-ray imaging element with high frame rate and low noise has been desired to be developed. For that purpose, a decreased dark current, a reduced capacitance, and an improved reading speed are required.

It is desirable to provide a light-receiving element, an X-ray imaging element, and an electronic apparatus that make it possible to achieve a decreased dark current, a reduced capacitance, and an improved reading speed.

A light-receiving element according to an embodiment of the present disclosure includes: a semiconductor substrate including a photoelectric conversion region; a first first electrically-conductive region provided at an interface of one surface of the semiconductor substrate and coupled to a first electrode; a second first electrically-conductive region provided at the interface of the one surface and around the first first electrically-conductive region and coupled to a second electrode; and a third first electrically-conductive region provided at the interface of the one surface and around the second first electrically-conductive region and being in an electrically floating state.

An X-ray imaging element according to an embodiment of the present disclosure includes a plurality of the light-receiving elements according to the embodiment of the present disclosure, generating signal charge based on an X-ray.

An electronic apparatus according to an embodiment of the present disclosure includes the X-ray imaging element according to the embodiment of the present disclosure.

In the light-receiving element according to the embodiment of the present disclosure, the X-ray imaging element according to the embodiment of the present disclosure, and the electronic apparatus according to the embodiment of the present disclosure, the second first electrically-conductive region coupled to a second electrode and the third first electrically-conductive region in an electrically floating state are arranged in this order around the first first electrically-conductive region coupled to a first electrode and being provided at the interface of the one surface of the semiconductor substrate including the photoelectric conversion. This allows a dark current generated at the interface of the one surface of the semiconductor substrate to be discharged from the second first electrically-conductive region, thus preventing the dark current from reaching the first first electrically-conductive region. In addition, the movement speed in a horizontal direction of signal charge generated in the semiconductor substrate 11 is improved.

BRIEF DESCRIPTION OF THE DRAWINGS

FIG. 1 is a schematic cross-sectional view of an example of a configuration of a light-receiving element according to a first embodiment of the present disclosure.

FIG. 2 is a schematic cross-sectional view of another example of the configuration of the light-receiving element according to the first embodiment of the present disclosure.

FIG. 3 is a schematic view of an example of a planar configuration of a p-type electrically-conductive region of the light-receiving element illustrated in FIG. 2.

FIG. 4 is a schematic view of another example of the planar configuration of the p-type electrically-conductive region of the light-receiving element illustrated in FIG. 2.

FIG. 5 is a schematic view of another example of the planar configuration of the p-type electrically-conductive region of the light-receiving element illustrated in FIG. 2.

FIG. 6 is a schematic view of an example of coupling of a power supply to an n-type electrically-conductive region in the light-receiving element illustrated in FIG. 2.

FIG. 7 is a schematic view of another example of the coupling of the power supply to the n-type electrically-conductive region in the light-receiving element illustrated in FIG. 2.

FIG. 8 is a schematic cross-sectional view of a configuration of a light-receiving element according to a second embodiment of the present disclosure.

FIG. 9 is a schematic cross-sectional view of a configuration of a light-receiving element according to a third embodiment of the present disclosure.

FIG. 10 is a schematic cross-sectional view of a configuration of a light-receiving element according to a fourth embodiment of the present disclosure.

FIG. 11 is a schematic view of an example of a planar configuration of a p-type electrically-conductive region of the light-receiving element illustrated in FIG. 10.

FIG. 12 is a schematic cross-sectional view of a configuration of a light-receiving element according to a fifth embodiment of the present disclosure.

FIG. 13 is a schematic view of an example of a planar configuration of an n-well of the light-receiving element illustrated in FIG. 12.

FIG. 14 is a schematic view of an example of a planar configuration of a p-type electrically-conductive region of a light-receiving element according to a modification example of the present disclosure.

FIG. 15 is a block diagram illustrating a configuration of an X-ray imaging element.

FIG. 16 is a block diagram illustrating a detailed configuration example of a column selection section illustrated in FIG. 15.

MODES FOR CARRYING OUT THE INVENTION

In the following, description is given in detail of embodiments of the present disclosure with reference to the drawings. The following description is merely a specific example of the present disclosure, and the present disclosure should not be limited to the following aspects. Moreover, the present disclosure is not limited to arrangements, dimensions, dimensional ratios, and the like of each component illustrated in the drawings. It is to be noted that the description is given in the following order.
1. First Embodiment (An example of a light-receiving element in which a drain is provided between an anode and a guard ring)
  1-1. Configuration of Light-Receiving Element
  1-2. Method of Manufacturing Light-Receiving Element
  1-3. Workings and Effects
2. Second Embodiment (An example in which an anode is extended in a direction of an n-type electrically-conductive layer)
3. Third Embodiment (An example in which an overhanging section of an anode is provided between an n-type electrically-conductive layer and an embedded layer)
4. Fourth Embodiment (An example of a light-receiving element in which linewidths of a plurality of guard rings and intervals therebetween are changed)
5. Fifth Embodiment (An example in which an embedded layer having concentration distributions of impurities)
6. Modification Example
7. Application Example 1. First Embodiment FIG. 1 schematically illustrates a cross-sectional configuration of a light-receiving element (a light-receiving element 10) according to a first embodiment of the present disclosure. The light-receiving element 10 includes, for example, a PIN (Positive Intrinsic Negative) type photodiode that applies a reverse bias between a front surface and a back surface of a semiconductor substrate 11. The light-receiving element 10 constitutes one pixel (pixel P) in an electromagnetic wave detector or a radiation imaging element (e.g., an X-ray imaging element 1; see FIG. 15) to read information on a subject (to capture an image of a subject) on the basis of a radioactive ray (e.g., α-ray, β-ray, γ-ray, and X-ray, etc.).
(1-1. Configuration of Light-Receiving Element)

In the light-receiving element 10, for example, a p-type electrically-conductive region (first electrically-conductive region) 13 is partially formed at an interface of one surface (a front surface S1; (one surface) of the semiconductor substrate 11 of n-type, and an n-type electrically-conductive layer (second electrically-conductive type layers) 12 is formed at an interface of a surface (a back surface S2; another surface) on a side opposite to the front surface S1. The p-type electrically-conductive region 13 is configured by a plurality of regions; the light-receiving element 10 of the present embodiment includes, for example, a region (first first electrically-conductive region) constituting an anode 13A, a region (second first electrically-conductive region) constituting a drain 13B, and a region (third first electrically-conductive region) constituting a guard ring 13C. Further, in the present embodiment, an n-type electrically-conductive region (second electrically-conductive region) is formed as an embedded layer 14 inside the semiconductor substrate 11. In addition, an insulating layer 15 is formed on the front surface S1 of the semiconductor substrate 11.

It is to be noted that, in the present embodiment, a description is given of a case where hole carriers, of excitons (electron/hole pairs) generated by photoelectric conversion, is read as signal charge. In addition, in the drawings, "− (minus)" attached to "p" and "n" indicates that a p-type or n-type impurity has a low concentration, and "+ (plus)" indicates that the p-type or n-type impurity has a high concentration. The magnitude relationships among concentrations of the p-type and n-type impurities are $p^- < p < p^+$ and $n^- < n < n^+$, respectively.

The semiconductor substrate 11 is configured by, for example, an n-type, p-type, or i-type (intrinsic semiconductor) semiconductor. As described above, the semiconductor substrate 11 includes the p-type electrically-conductive region (first electrically-conductive region) 13 formed at the interface on a side of the front surface S1, and includes a p-i-n junction or a p-n junction to serve as a photoelectric conversion region. It is to be noted that the present embodiment exemplifies the use of an n-type semiconductor substrate as the semiconductor substrate 11. A film thickness (hereinafter, simply referred to as a "thickness") of the semiconductor substrate 11 in a stacking direction (Y-axis direction) is, for example, 10 μm or more and 700 μm or less.

The p-type electrically-conductive region 13 is a region (p-type impurity region) including the p-type impurities, and a plurality of p-type electrically-conductive regions 13 is formed at the interface on the side of the front surface S1 of the semiconductor substrate 11. Specifically, the p-type electrically-conductive region 13 includes three regions: a region constituting the anode 13A; a region constituting the drain 13B; and a region constituting the guard ring 13C. The regions are spaced apart from each other; the drain 13B is formed in a ring shape around the anode 13A, and the guard ring 13C is formed in a ring shape around the drain 13B. As for a thickness, for example, the p-type electrically-conductive region 13 is formed at a thickness of 2 μm to 3 μm, for example, from the interface of the front surface S1 of the semiconductor substrate 11, for example, in a case where a pitch of the pixel P is 10 μm or more and 100 μm or less, depending on a configuration of the pixel P.

The anode 13A is an electrode that receives application of a voltage to read hole carriers (h+) as signal charge, for example, among charge carriers generated by photoelectric conversion; the anode 13A is coupled to an electrode 16 (first electrode), for example. For example, the anode 13A is individually formed at the middle of the pixel P. The planar shape of the anode 13A is not particularly limited, and may be a circular shape (see, e.g., FIG. 3) or a polygonal shape. A size of the anode 13A is, for example, 0.100μ or more and 10 µm or less in a case where the pitch of the pixel P is 10 µm or more and 100 µm or less, for example, depending on a size of the pixel P.

The drain 13B is an electrode that receives application of a voltage to discharge a dark current generated at the interface of the front surface S1 at the time of irradiation of the semiconductor substrate 11 with light; the drain 13B is coupled to, for example, an electrode 17 (second electrode). The drain 13B is formed in a ring shape around the anode 13A, thereby allowing the dark current generated at the interface of the front surface S1 at the time of the irradiation of the semiconductor substrate 11 with light to be constantly discharged from the drain 13B. This makes it possible to prevent the dark current from flowing into the anode 13A. A planar shape of the drain 13B is not particularly limited, and may be an annular shape or a polygonal shape (see, e.g., FIG. 3).

The guard ring 13C is provided to generate a horizontal electric field that alleviates the concentration of an electric field on the drain 13B and simultaneously assists transportation of signal carriers in a horizontal direction. The guard ring 13C is formed in a ring shape around the drain 13B to surround the anode 13A and the drain 13B. Unlike the anode 13A and drain 13B, the guard ring 13C is in an electrically floating state. As illustrated in FIG. 1, one guard ring 13C may be formed around the drain 13B (in a single-layered manner), or a plurality of guard rings 13C may be formed. FIG. 2 schematically illustrates another example of the cross-sectional configuration of the light-receiving element 10 according to the present embodiment, and FIG. 3 schematically illustrates a planar configuration of the guard ring 13C of the light-receiving element 10 illustrated in FIG. 2. In the light-receiving element 10 illustrated in FIGS. 2 and 3, the guard ring 13C includes three p-type electrically-conductive regions, and is formed triply (guard rings 13C1, 13C2, and 13C3) around the drain 13B. In this manner, providing the plurality of guard rings 13C enables the concentrated electric field to be distributed to a plurality of locations and at the same time to generate the horizontal electric field in a wide region.

In a case where the drain 13B and the guard ring 13C are formed to have a polygonal shape (e.g., a rectangle shape), the corners are preferably formed to have a curved shape as illustrated in FIG. 3. This allows the concentration of the electric field at the corners to be alleviated. In addition, although FIG. 3 exemplifies the drain 13B and the guard ring 13C being continuously provided around the anode 13A, this is not limitative. For example, as illustrated in FIG. 4, the drain 13B and the guard ring 13C may be partially cut, or may be formed intermittently.

Further, a linewidth of the ring constituting the drain 13B and the guard ring 13C is preferably 0.100 µm or more and 10 µm or less, for example. An interval between the drain 13B and the guard ring 13C is preferably 0.100 µm or more and 10 µm or less. However, the interval between the drain 13B and the guard ring 13C and the line width of the drain 13B and the guard ring 13C are not necessarily constant. For example, in a case where the drain 13B and the plurality of guard rings 13C are each formed to have a polygonal shape (e.g., rectangular shape), the intervals between the drain 13B and the guard ring 13C and among the guard rings 13C1, 13C2, and 13C3 is preferably formed to allow the corner (Wb) to be wider than a straight part (Wa) as illustrated in FIG. 5. This further alleviates the concentration of the electric field at the corners.

The n-type electrically-conductive layer 12 is a region (n-type impurity region) including n-type impurities having a concentration higher than those of an n-type semiconductor substrate 11, and is formed at an interface on a side of the back surface S2 of the semiconductor substrate 11. For example, a power supply VDD is coupled to the n-type electrically-conductive layer 12. In a case where, for example, hole carriers, among charge carriers generated by photoelectric conversion, are read as signal charge through the anode 13A, electron carriers (e−) are able to be discharged through the n-type electrically-conductive layer 12. As for a thickness, for example, the n-type electrically-conductive layer 12 is formed at a thickness of 1 µm, for example, from the interface of the back surface S2 of the semiconductor substrate 11, for example, in a case where the pitch of the pixel P is 10 µm or more and 100 µm or less, depending on the configuration of the pixel P.

FIGS. 6 and 7 each illustrate an example of a method of coupling a power supply to the n-type electrically-conductive layer 12. In FIG. 6, a transparent electrode 18 is formed on the n-type electrically-conductive layer 12, and the power supply VDD is coupled to the transparent electrode 18 to apply a voltage from the side of the back surface S2 of the semiconductor substrate 11. FIG. 7 illustrates a peripheral region 110B around a pixel region 110A in which a plurality of pixels P are arranged. In the peripheral region 110B, a neutral region 11N is formed outside a depletion region 11D formed in the semiconductor substrate 11, through which a voltage is applied via an n-type electrically-conductive region 19 provided at the interface of the front surface S1 of the semiconductor substrate 11. It is to be noted that, in this case, as illustrated in FIG. 7, it is preferable to form a plurality of high-voltage guard rings 13D between the n-type electrically-conductive region 19 and the pixel P formed in the pixel region 110A at the interface of the front surface S1 of the semiconductor substrate 11 in the peripheral region 110B. Among the plurality of high-voltage guard rings 13D, a high-voltage guard ring arranged closest to the pixel region 110A is preferably coupled to a ground GND.

The embedded layer 14 is provided to prevent charge carriers (hole carriers in this example) generated in the semiconductor substrate 11 by photoelectric conversion from being transferred to the drain 13B or the guard ring 13C. The embedded layer 14 is an n-type electrically-conductive region including n-type impurities of higher concentration than those of the n-type semiconductor substrate 11 and embedded inside the semiconductor substrate 11, specifically, near the p-type electrically-conductive region 13. More particularly, the embedded layer 14 is provided in a region corresponding to the drain 13B and the guard ring 13C, of the p-type electrically-conductive region 13, and has an opening in a region facing the anode 13A. This allows signal charge (hole carriers) generated in the semiconductor substrate 11 to be efficiently read from the anode 13A. It is to be noted that the embedded layer 14 is preferably disposed not to be in direct contact with the drain 13B and the guard ring 13C. A thickness of the embedded layer 14 is, for example, 0.100 µm or more and 10 µm or less, although it varies depending on the magnitude of an applied reverse bias voltage to be applied between the front surface S1 and the back surface S2 of the semiconductor substrate 11.

The insulating layer 15 is formed on the front surface S1 of the semiconductor substrate 11, and is formed using an inorganic insulating material, for example. Examples of the inorganic insulating material include silicon nitride (SiN), aluminum oxide ($Al_2O_3$), silicon oxide ($SiO_2$), and hafnium oxide ($HfO_2$). The insulating layer 15 includes at least one of these materials. Although not illustrated, for example, a logic circuit and the like are formed on the insulating layer 15.

(1-2. Method of Manufacturing Light-Receiving Element)

The light-receiving element 10 can be produced, for example, as follows. First, the n-type electrically-conductive layer 12 is formed on the back surface S2 of the semiconductor substrate 11 using an ion implantation technique. Subsequently, a mask is formed on a predetermined region of the front surface S1 of the semiconductor substrate 11, and then n-type impurities (e.g., phosphorus (P)) are doped using an ion implantation technology to form an n-type electrically-conductive region (embedded layer 14). Next, a mask is formed on a predetermined region of the front surface S1 of the semiconductor substrate 11, and then p-type impurities (e.g., boron (B)) are doped using an ion implantation technology to form p-type electrically-conductive regions (anode 13A, drain 13B, and guard ring 13C). Finally, the insulating layer 15 is formed on the front surface S1 of the semiconductor substrate 11 using a CVD (Chemical Vapor Deposition) method, for example. This completes the light-receiving element 10 illustrated in FIG. 1.

(1-3. Workings and Effects)

As described above, solid-state imaging devices are used in various applications including, for example, an imaging device such as a digital still camera or a video camera, an electronic apparatus such as a mobile terminal apparatus having an imaging function, or an electromagnetic wave sensor that detects various wavelengths other than that of visible light. In these solid-state imaging devices, a CMOS image sensor has been widely used that reads signal charge accumulated in a photodiode, as a photoelectric conversion element, via a MOS transistor.

A unit pixel of the CMOS image sensor includes, in a semiconductor substrate, for example, a photodiode (PD) including an HAD (Hole Accumulated Diode) structure and a floating diffusion region (FD) disposed at a position across the photodiode with a transfer gate interposed therebetween. In addition thereto, the unit pixel includes, for example, a reset transistor, a select transistor, and an amplifier transistor.

In addition, examples of another form of the unit pixel of the CMOS image sensor include a structure in which the photoelectric conversion region and the FD are integrated in a semiconductor substrate without including the HAD. In addition to being simple and easy to be manufactured, this structure is able to add any potential difference to a p-n junction that forms the photoelectric conversion region. Therefore, it is easy to increase the thickness of the photoelectric conversion region, and thus the structure has often been used, by taking advantage thereof, in a sensor for scientific use that requires high sensitivity measurement.

Incidentally, in recent years, for a sensor for scientific use, an X-ray imaging element with characteristics of high-speed drive and low noise has been desired to be developed. Specifically, an improvement in resistance to higher frame rate and high energy input is required. However, the CMOS image sensor mentioned as the above-described another form involves an issue in which an increased size of the FD causes a capacitance to be increased. Meanwhile, a decreased size of the FD lowers a transfer speed of signal charge, which is an issue; there is a limit to the higher frame rate. In addition, in the CMOS image sensor mentioned above as another form, a front surface of the semiconductor substrate is in contact with a depletion layer. Therefore, for example, fluctuations in a capacity and an electric field are large at the time when fixed electric charge is generated at an insulating film or an interface thereof provided on the semiconductor substrate due to incidence of a strong radioactive ray, causing low resistance to high energy input, which is an issue.

In contrast, the light-receiving element 10 of the present embodiment is provided with the anode 13A and the drain 13B. The anode 13A is configured by the p-type electrically-conductive region at the interface of the front surface S1 of the n-type semiconductor substrate 11 that forms a photoelectric conversion region, and is coupled to the electrode 16. The drain 13B is configured by the p-type electrically-conductive region in the same manner around the anode 13A, and is coupled to an electrode (electrode 17) different from the anode 13A. This allows, for example, the drain 13B to discharge a dark current generated at the interface of the semiconductor substrate 11 at the time of X-ray irradiation, thus making it possible to prevent the dark current from reaching the anode 13A. Further, the guard ring 13C configured by the p-type electrically-conductive region in the same manner and being in an electrically floating state is provided around the drain 13B. This makes it possible to improve a movement speed in a plane direction of signal charge (hole carriers in this example) generated in the semiconductor substrate 11.

As described above, in the present embodiment, the drain 13B coupled to the electrode 17 different from the electrode 16 coupled to the anode 13A is provided around the anode 13A which is provided at the interface of the front surface S1 of the semiconductor substrate 11. Further, the guard ring 13C in a floating state is further provided around the drain 13B. This makes it possible to improve the movement speed in a plane direction of signal charge (hole carriers in this example) generated in the semiconductor substrate 11, and thus to improve a transfer speed of signal charge without increasing the size of the anode 13A. In addition, for example, when a dark current is generated at the interface of the semiconductor substrate 11 at the time of X-ray irradiation, it is possible to discharge the dark current using the drain 13B, and thus to improve the resistance to high energy input. It is therefore possible to achieve a decreased dark current, a reduced capacitance, and an improved reading speed.

In addition, the light-receiving element 10 of the present embodiment includes the embedded layer 14 which has a high n-type impurity concentration and is formed inside the semiconductor substrate 11, specifically, near the drain 13B and the guard ring 13C. This makes it possible to prevent the signal charge (hole carriers in this example) generated in the semiconductor substrate 11 from leaking into the drain 13B or the guard ring 13C. It is therefore possible to further improve transfer conversion efficiency.

Next, descriptions are given of second to fifth embodiments, and a modification example of the foregoing first embodiment or the like. Hereinafter, components similar to those of the foregoing first embodiment are denoted by the same reference numerals, and descriptions thereof are omitted as appropriate.

2. Second Embodiment

FIG. 8 schematically illustrates a cross-sectional configuration of a light-receiving element (a light-receiving element 20) according to a second embodiment of the present disclosure. In the same manner as the foregoing first embodiment, the light-receiving element 20 includes, for example, a PIN type photodiode that applies a reverse bias between the front surface and the back surface of the semiconductor substrate 11. The light-receiving element 20 constitutes one pixel (pixel P) in an electromagnetic wave detector or a radiation imaging element (e.g., X-ray imaging element 1; see FIG. 15) to read information on a subject (to capture an image of a subject) on the basis of a radioactive ray (e.g., α-ray, β-ray, γ-ray, and X-ray, etc.).

The light-receiving element 20 includes, for example, a p-type electrically-conductive region 23 being formed at the interface of the front surface S1 of the n-type semiconductor substrate 11 and including, for example, an anode 23A, the drain 13B, and the guard ring 13C. The n-type electrically-conductive layer 12 is formed at the interface of the back surface S2 of the semiconductor substrate 11. The light-receiving element 20 of the present embodiment includes an extending section 23X1 in which the anode 23A extends to the side of the back surface S2, whereby a lower end of the anode 13A is formed at a position deeper than the drain 13B and the guard ring 13C. The extending section 23X1 preferably protrudes to a side closer to the back surface S2 than a bottom surface of the embedded layer 14 formed below the drain 13B and the guard ring 13C, for example.

As described above, in the present embodiment, the anode 23A formed at the interface of the front surface S1 of the n-type semiconductor substrate 11 is provided with the extending section 23X1, and a tip thereof is formed inside the n-type semiconductor substrate 11, specifically, is formed to protrude to the side closer to the back surface S2 than the bottom surface of the embedded layer 14 formed below the drain 13B and the guard ring 13C. This achieves an effect of being able to further improve efficiency of transferring signal charge (e.g., hole carriers) generated in the semiconductor substrate 11, in addition to the effects of the foregoing first embodiment.

3. Third Embodiment

FIG. 9 illustrates a cross-sectional configuration of a light-receiving element (a light-receiving element 30) according to a third embodiment of the present disclosure. In the same manner as the foregoing first embodiment, the light-receiving element 30 includes, for example, a PIN type photodiode that applies a reverse bias between the front surface and the back surface of the semiconductor substrate 11. The light-receiving element 30 constitutes one pixel (pixel P) in an electromagnetic wave detector or a radiation imaging element (e.g., X-ray imaging element 1; see FIG. 15) to read information on a subject (to capture an image of a subject) on the basis of a radioactive ray (e.g., α-ray, β-ray, γ-ray, and X-ray, etc.).

In the light-receiving element 30, for example, a p-type electrically-conductive region 33 including an anode 33A, the drain 13B, and the guard ring 13C is formed at the interface of the front surface S1 of the n-type semiconductor substrate 11. The n-type electrically-conductive layer 12 is formed at the interface of the back surface S2 of the semiconductor substrate 11. In the light-receiving element 30 of the present embodiment, the anode 33A includes an extending section 33X1 extending to the side of the back surface S2, and an overhanging section 33X2 overhanging the semiconductor substrate 11 in a plane direction (e.g., an X-Z plane direction) at a tip thereof. The overhanging section 33X2 is provided in an underlayer of the embedded layer 14 formed below the drain 13B and the guard ring 13C. A tip of the overhanging section 33X2 preferably extends to the end of the pixel P. Alternatively, the tip of the overhanging section 33X2 may be formed to be continuous with the overhanging section 33X2 of another pixel P arranged adjacently.

As described above, in the present embodiment, the anode 33A formed at the interface of the front surface S1 of the n-type semiconductor substrate 11 is provided with the extending section 33X1, and the tip thereof is provided with the overhanging section 33X2 overhanging the semiconductor substrate 11 in the plane direction. This achieves an effect of being able to further improve efficiency of transferring signal charge (e.g., hole carriers) generated in the semiconductor substrate 11, in addition to the effects of the foregoing second embodiment.

4. Fourth Embodiment

FIG. 10 illustrates a cross-sectional configuration of a light-receiving element (a light-receiving element 40) according to a fourth embodiment of the present disclosure. FIG. 11 schematically illustrates a planar configuration of a p-type electrically-conductive region 43 of the light-receiving element 40 illustrated in FIG. 10. In the same manner as the foregoing first embodiment, the light-receiving element 40 includes, for example, a PIN type photodiode that applies a reverse bias between the front surface and the back surface of the semiconductor substrate 11. The light-receiving element 40 constitutes one pixel (pixel P) in an electromagnetic wave detector or a radiation imaging element (e.g., X-ray imaging element 1; see FIG. 15) to read information on a subject (to capture an image of a subject) on the basis of a radioactive ray (e.g., α-ray, β-ray, γ-ray, and X-ray, etc.).

In the light-receiving element 40, for example, the p-type electrically-conductive region 33 including an anode 43A, a drain 43B, and a guard ring 43C is formed at the interface of the front surface S1 of the n-type semiconductor substrate 11, for example. The n-type electrically-conductive layer 12 is formed at the interface of the back surface S2 of the semiconductor substrate 11. The light-receiving element 40 of the present embodiment has a configuration in which outer one of a plurality of (three in this case) guard rings 43C1, 43C2, and 43C3 is formed to have a wider linewidth of the guard rings 43C1, 43C2, and 43C3 and a wider interval between the guard rings 43C1, 43C2, and 43C3.

As described above, in the present embodiment, the guard rings 43C1, 43C2, and 43C3 are formed to allow a linewidth of the guard rings 43C1, 43C2, and 43C3 and an interval between the guard rings 43C1, 43C2, and 43C3 to be wider as being outward. This achieves an effect of being able to efficiently alleviate concentration of electric fields between the guard rings 43C1, 43C2, and 43C3, in addition to the effects of the foregoing first embodiment.

In addition, in a case where the guard rings 13C1, 13C2, and 13C3 are arranged at an equal interval as in the foregoing first embodiment, a potential difference between the guard rings becomes smaller as being outward, which may possibly diminish a transfer electric field (horizontal electric field). In contrast, as in the present embodiment, by allowing the interval between the guard rings 43C1, 43C2, and 43C3 to be wider as being outward, a potential difference between the guard rings 43C1, 43C2, and 43C3 is equalized, thus achieving an effect of equalizing horizontal electric fields toward the anode 43A inside the pixel P.

5. Fifth Embodiment

FIG. 12 illustrates a cross-sectional configuration of a light-receiving element (a light-receiving element 50) according to a fifth embodiment of the present disclosure. FIG. 13 schematically illustrates a planar configuration of the p-type electrically-conductive region 13 and an embedded layer 54 of the light-receiving element 50 illustrated in FIG. 12. In the same manner as the foregoing first embodiment, the light-receiving element 50 includes, for example, a PIN type photodiode that applies a reverse bias between the front surface and the back surface of the semiconductor substrate 11. The light-receiving element 50 constitutes one pixel (pixel P) in an electromagnetic wave detector or a radiation imaging element (e.g., X-ray imaging element 1; see FIG. 15) to read information on a subject (to capture an image of a subject) on the basis of a radioactive ray (e.g., α-ray, β-ray, γ-ray, and X-ray, etc.).

In the light-receiving element 50, for example, the p-type electrically-conductive region 33 including the anode 33A, the drain 13B, and the guard ring 13C is formed at the interface of the front surface S1 of the n-type semiconductor substrate 11, for example. The n-type electrically-conductive layer 12 is formed at the interface of the back surface S2 of the semiconductor substrate 11. The light-receiving element 50 of the present embodiment differs from that of the foregoing first embodiment in that the embedded layer 54 provided as an underlayer of the drain 13B and the guard ring 13C has a region having a locally higher impurity concentration. Specifically, the embedded layer 54 includes, for example, an impurity region 54a having n-type impurities of the same concentration as that of the embedded layer 14 in the foregoing first embodiment, and a high impurity region 54b having an impurity concentration higher than that of the impurity region 54a. The high impurity region 54b is preferably formed in a region in which a leakage of signal charge (hole carriers in this example) generated in the semiconductor substrate 11 into the drain 13B or the guard ring 13C easily occurs.

As described above, in the present embodiment, the region (high impurity region 54b) having a locally higher impurity concentration is formed in the embedded layer 54. This makes it possible to reinforce a region in which a leakage of signal charge generated in the semiconductor substrate 11 into the drain 13B or the guard ring 13C easily occurs, thus achieving an effect of being able to further improve efficiency of transferring signal charge (e.g., hole carriers) generated in the semiconductor substrate 11, in addition to the effects of the foregoing first embodiment.

6. Modification Example

FIG. 14 schematically illustrates a planar configuration of a p-type electrically-conductive region 63 in a light-receiving element (a light-receiving element 60) according to a modification example of the foregoing first embodiment or the like of the present disclosure, together with another adjacent pixel P. In the same manner as the foregoing first embodiment, the light-receiving element 60 includes, for example, a PIN type photodiode that applies a reverse bias between the front surface and the back surface of the semiconductor substrate 11. The light-receiving element 60 constitutes one pixel (pixel P) in an electromagnetic wave detector or a radiation imaging element (e.g., X-ray imaging element 1; see FIG. 15) to read information on a subject (to capture an image of a subject) on the basis of a radioactive ray (e.g., α-ray, β-ray, γ-ray, and X-ray, etc.).

In the foregoing first embodiment, the p-type electrically-conductive region 13 has a configuration in which the anode 13A is arranged at the center of the pixel P, with the drain 13B and the guard ring 13C being arranged in this order therearound; however, this is not limitative. For example, as illustrated in FIG. 14, an anode 63A may be formed at one corner of the pixel P in a rectangle shape, for example. In this case, for example, as illustrated in FIG. 14, four pixels P adjacent to one another may be used as one set to form the anodes 63A in the middle of the set, for example. In this case, the drain 63B is preferably formed to surround each of the anodes 63A. This prevents a dark current from flowing into the anode 63A, thus making it possible to improve the resistance to high energy input. The guard rings 63C1, 63C2, and 63C3 are provided to surround the anode 63A and the drain 63B provided in each of the four pixels P.

7. Application Example

FIG. 15 illustrates a functional configuration of the X-ray imaging element 1 using an element structure of the light-receiving element (e.g., light-receiving element 10) described in the foregoing first to fifth embodiments and the modification example. The X-ray imaging element 1 reads information on a subject (captures an image of a subject) on the basis of an incident radioactive ray Rrad (e.g., α-ray, β-ray, γ-ray, and X-ray, etc.), for example. The X-ray imaging element 1 includes a pixel section (pixel region 110A), and includes, as a drive circuit (peripheral circuit section) of the pixel region 110A, a row scanning section 121, an A/D conversion section 122, a column scanning section 123, and a system control section 124.

(Pixel Region 110A)

The pixel region 110A includes a plurality of pixels (imaging pixels) P that generates signal charge on the basis of a radioactive ray. The plurality of pixels P are two-dimensionally arranged in matrix (in a matrix shape). It is to be noted that, as illustrated in FIG. 1, a horizontal direction (row direction) in the pixel region 110A is defined as an "H" direction, and a vertical direction (column direction) is defined as a "V" direction.

(Row Scanning Section 121)

The row scanning section 121 includes a later-described shift register circuit, a predetermined logic circuit, and the like, and is a pixel drive section (row scanning circuit) that performs driving (line-sequential scanning), on a row-by-row basis (in unit of horizontal lines), on the plurality of pixels P in the pixel region 110A. Specifically, the row scanning section 121 performs an imaging operation such as a read operation or a reset operation on each of the pixels P by line-sequential scanning, for example. It is to be noted that this line-sequential scanning is performed by supplying each of the pixels P with a row scanning signal described above via a readout control line Lread.

(A/D Conversion Section 122)

The A/D conversion section 122 includes a plurality of column selection sections 125 each provided for every plurality of (four in this example) signal lines Lsig, and performs A/D conversion (analog/digital conversion) on the basis of a signal voltage (voltage in response to signal charge) inputted via the signal line Lsig. This allows output data Dout (imaging signal) including a digital signal to be generated and outputted to the outside.

For example, as illustrated in FIG. 16, each of the column selection sections 125 includes a charge amplifier 172, a capacitor (condenser or feedback capacitor, etc.) C1, a switch SW1, a sample-and-hold (S/H) circuit 173, a multiplexer circuit (selection circuit) 174 including four switches SW2, and an A/D converter 175. Of these, the charge amplifier 172, the capacitor C1, the switch SW1, the S/H circuit 173, and the switch SW2 are provided for each of the signal lines Lsig. The multiplexer circuit 174 and the A/D converter 175 are provided for each of the column selection sections 125. It is to be noted that the charge amplifier 172, the capacitor C1, and the switch SW1 constitute a charge amplifier circuit.

The charge amplifier 172 is an amplifier (amplifier) to perform conversion (Q-V conversion) of signal charge read from the signal line Lsig. In the charge amplifier 172, one end of the signal line Lsig is coupled to an input terminal on a negative side (− side), and a predetermined reset voltage Vrst is inputted to an input terminal on a positive side (+ side). An output terminal and the input terminal on the negative of the charge amplifier 172 are feedback-coupled to each other (feedback coupling) via a parallel connection circuit of the capacitor C1 and the switch SW1. That is, one terminal of the capacitor C1 is coupled to the input terminal on the negative side of the charge amplifier 172, and another terminal thereof is coupled to the output terminal of the charge amplifier 172. Likewise, one terminal of the switch SW1 is coupled to the input terminal on the negative side of the charge amplifier 172, and another terminal thereof is coupled to the output terminal of the charge amplifier 172. It is to be noted that an ON/OFF state of the switch SW1 is controlled by a control signal (amplifier reset control signal) supplied from the system control section 124 via an amplifier reset control line Lcarst.

The S/H circuit 173 is disposed between the charge amplifier 172 and the multiplexer circuit 174 (switch SW2), and is a circuit to temporarily hold an output voltage Vca from the charge amplifier 172.

The multiplexer circuit 174 is a circuit that selectively couples or decouples each of the S/H circuits 173 and the A/D converter 175 to and from each other by sequentially bringing one of the four switches SW2 into an ON state in accordance with scan driving by the column scanning section 123.

The A/D converter 175 is a circuit that generates and outputs the above-described output data Dout by performing A/D conversion on an output voltage from the S/H circuit 173 inputted via the switch SW2.

(Column Scanning Section 123)

The column scanning section 123 includes, for example, an unillustrated shift register, address decoder, and the like, and drives the switches SW2 in sequence in the above-described column selection section 125 while scanning. Such selective scanning by the column scanning section 123 allows signals (output data Dout described above) of the respective pixels P read via the respective signal lines Lsig to be outputted in sequence to the outside.

(System Control Section 124)

The system control section 124 controls respective operations of the row scanning section 121, the A/D conversion section 122, and the column scanning section 123. Specifically, the system control section 124 includes a timing generator that generates various timing signals (control signals) described above, and performs drive control of the row scanning section 121, the A/D conversion section 122, and the column scanning section 123 on the basis of the various timing signals generated by the timing generator. On the basis of the control of the system control section 124, the row scanning section 121, the A/D conversion section 122, and the column scanning section 123 each perform imaging driving (line-sequential imaging driving) on the plurality of pixels P in the pixel region 110A, thereby allowing the output data Dout to be acquired from the pixel region 110A.

Although the description has been given above by referring to the first to fifth embodiments, Modification Examples 1 to 8, and the application example, the contents of the present disclosure are not limited to the foregoing embodiments, and the like, and may be modified in a wide variety of ways. For example, the foregoing embodiment, and the like exemplify the use of hole carriers as signal charge; however, electron carriers may be used as the signal charge. It is to be noted, in that case, each member has an electrically-conductive type which is the opposite electrically-conductive type.

In addition, the layer configuration of the light-receiving element 10 described in the foregoing embodiments, and the like is merely exemplary, and another layer may further be included. Further, the materials or the thicknesses of the respective layers are also exemplary, and are not limited to those described above.

Furthermore, although the foregoing application example mentions the X-ray imaging element 1, the light-receiving element (e.g., light-receiving element 10) described in the foregoing embodiment, and the like is also applicable to a radiation imaging element or an electromagnetic wave detector of which application is not limited to an X-ray.

It is to be noted that the effects described herein are merely exemplary and non-limiting, and may have other effects.

It is to be noted that the present disclosure may also have the following configurations. According to the present technology of the following configuration, a second first electrically-conductive region coupled to a second electrode is arranged between a first first electrically-conductive region coupled to a first electrode and being provided at an interface of one surface of a semiconductor substrate and a third electrically-conductive region in an electrically floating state. This reduces the arrival of a dark current generated at the interface of the one surface of the semiconductor substrate at the first first electrically-conductive region. In addition, the movement speed in a plane direction of signal charge generated in the semiconductor substrate 11 is improved. This makes it possible to reduce a size of the first first electrically-conductive region as compared with the pixel area, and thus to achieve a decreased dark current, a reduced capacitance, and an improved reading speed.

(1)

A light-receiving element including:
 a semiconductor substrate including a photoelectric conversion region;
 a first first electrically-conductive region provided at an interface of one surface of the semiconductor substrate and coupled to a first electrode;
 a second first electrically-conductive region provided at the interface of the one surface and around the first first electrically-conductive region and coupled to a second electrode; and
 a third first electrically-conductive region provided at the interface of the one surface and around the second first electrically-conductive region and being in an electrically floating state.

(2)

The light-receiving element according to (1), in which the semiconductor substrate further includes a second electrically-conductive layer at an interface of another surface opposed to the one surface.

(3)

The light-receiving element according to (1) or (2), in which a plurality of the third first electrically-conductive regions are formed around the second first electrically-conductive region.

(4)

The light-receiving element according to any one of (1) to (3), in which the second first electrically-conductive region is provided continuously around the first first electrically-conductive region.

(5)

The light-receiving element according to any one of (1) to (4), in which the third first electrically-conductive region is provided continuously around the second first electrically-conductive region.

(6)

The light-receiving element according to any one of (1) to (5), in which the second first electrically-conductive region and the third first electrically-conductive region are arranged in this order about the first first electrically-conductive region, and each have a polygonal planar shape with corners being formed in a curved shape.

(7)

The light-receiving element according to any one of (1) to (6), in which the semiconductor substrate further includes a second electrically-conductive region embedded and formed in the substrate.

(8)

The light-receiving element according to (7), in which the second electrically-conductive region has an opening at a position facing the first first electrically-conductive region.

(9)

The light-receiving element according to (7) or (8), in which the second electrically-conductive region includes regions of different impurity concentrations.

(10)

The light-receiving element according to any one of (2) to (9), in which the first first electrically-conductive region extends in a direction toward the other surface beyond the second first electrically-conductive region and the third first electrically-conductive region.

(11)

The light-receiving element according to any one of (7) to (10), in which the first first electrically-conductive region extends in the direction toward the other surface opposed to the one surface, the first first electrically-conductive region including, on a side closer to the other surface than the second electrically-conductive region, an overhanging section further extending in a horizontal direction.

(12)

The light-receiving element according to any one of (3) to (11), in which the plurality of the third first electrically-conductive regions formed around the second first electrically-conductive region have line widths different from one another.

(13)

The light-receiving element according to any one of (3) to (12), in which a linewidth of each of the plurality of the third first electrically-conductive regions formed around the second first electrically-conductive region becomes wider stepwise as being away from the first first electrically-conductive region.

(14)

The light-receiving element according to any one of (3) to (13), in which an interval between the plurality of the third first electrically-conductive regions formed around the second first electrically-conductive region becomes wider stepwise as being outward.

(15)

The light-receiving element according to any one of (1) to (14), in which the semiconductor substrate further includes the second electrically-conductive region, and the second electrically-conductive layer and the second electrically-conductive region each have an impurity concentration higher than the semiconductor substrate.

(16)

The light-receiving element according to any one of (1) to (15), in which the semiconductor substrate is configured by an intrinsic semiconductor.

(17)

An X-ray imaging element including a plurality of light-receiving elements generating signal charge based on an X-ray, the light-receiving elements each including a semiconductor substrate including a photoelectric conversion region, a first first electrically-conductive region provided at an interface of one surface of the semiconductor substrate and coupled to a first electrode, a second first electrically-conductive region provided at the interface of the one surface and around the first first electrically-conductive region and coupled to a second electrode, and a third first electrically-conductive region provided at the interface of the one surface and around the second first electrically-conductive region and being in an electrically floating state.

(18)

The X-ray imaging element according to (17), including a pixel region in which a plurality of pixels are arranged; and a peripheral region provided around the pixel region, in which the semiconductor substrate includes a depletion region in the pixel region and includes a neutral region in the peripheral region.

(19)

The X-ray imaging element according to (17) or (18), in which the light-receiving elements are provided for the respective pixels, and the light-receiving element includes a p-n junction light-receiving element that applies a reverse bias between the one surface of the semiconductor substrate and another surface opposed to the one surface.

(20)

An electronic apparatus including an X-ray imaging element, the X-ray imaging element including a plurality of light-receiving elements generating signal charge based on an X-ray, the light-receiving elements each including a semiconductor substrate including a photoelectric conversion region, a first first electrically-conductive region provided at an interface of one surface of the semiconductor substrate and coupled to a first electrode, a second first electrically-conductive region provided at the interface of the one surface and around the first first electrically-conductive region and coupled to a second electrode, and a third first electrically-conductive region provided at the interface of the one surface and around the second first electrically-conductive region and being in an electrically floating state.

This application claims the benefit of Japanese Priority Patent Application JP2021-075730 filed with the Japan Patent Office on Apr. 28, 2021, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A light-receiving element comprising:
a semiconductor substrate including a photoelectric conversion region;
a first electrically-conductive region provided at an interface of one surface of the semiconductor substrate and coupled to a first electrode;
a second electrically-conductive region provided at the interface of the one surface and around the first electrically-conductive region and coupled to a second electrode; and
a third electrically-conductive region provided at the interface of the one surface and around the second electrically-conductive region and being in an electrically floating state,
wherein
a plurality of the third electrically-conductive regions are formed around the second electrically-conductive region, and
the plurality of the third electrically-conductive regions formed around the second electrically-conductive region have line widths different from one another.

2. The light-receiving element according to claim 1, wherein the semiconductor substrate further includes an electrically-conductive layer at an interface of another surface opposed to the one surface.

3. The light-receiving element according to claim 1, wherein the second electrically-conductive region is provided continuously around the electrically-conductive region.

4. The light-receiving element according to claim 1, wherein the third electrically-conductive region is provided continuously around the second electrically-conductive region.

5. The light-receiving element according to claim 1, wherein the second electrically-conductive region and the third electrically-conductive region are arranged in this order about the first electrically-conductive region, and each have a polygonal planar shape with corners being formed in a curved shape.

6. The light-receiving element according to claim 1, wherein the semiconductor substrate further includes a fourth electrically-conductive region embedded and formed in the substrate.

7. The light-receiving element according to claim 6, wherein the fourth electrically-conductive region has an opening at a position facing the first electrically-conductive region.

8. The light-receiving element according to claim 6, wherein the fourth electrically-conductive region includes regions of different impurity concentrations.

9. The light-receiving element according to claim 2, wherein the first electrically-conductive region extends in a direction toward the other surface beyond the second electrically-conductive region and the third first electrically-conductive region.

10. The light-receiving element according to claim 6, wherein the first electrically-conductive region extends in a direction toward another surface opposed to the one surface, the first electrically-conductive region including, on a side closer to the other surface than the fourth electrically-conductive region, an overhanging section further extending in a horizontal direction.

11. The light-receiving element according to claim 1, wherein a linewidth of each of the plurality of the third electrically-conductive regions formed around the second electrically-conductive region becomes wider stepwise as being away from the electrically-conductive region.

12. The light-receiving element according to claim 1, wherein an interval between the plurality of the third electrically-conductive regions formed around the second electrically-conductive region becomes wider stepwise as being outward.

13. The light-receiving element according to claim 2, wherein
the semiconductor substrate further includes a fourth electrically-conductive region, and
the electrically-conductive layer and the fourth electrically-conductive region each have an impurity concentration higher than the semiconductor substrate.

14. The light-receiving element according to claim 1, wherein the semiconductor substrate is configured by an intrinsic semiconductor.

15. An X-ray imaging element comprising a plurality of light-receiving elements generating signal charge based on an X-ray,
wherein each one of the light-receiving elements is the light-receiving element according to claim 1.

16. The X-ray imaging element according to claim 15, comprising
a pixel region in which a plurality of pixels are arranged; and
a peripheral region provided around the pixel region, wherein
the semiconductor substrate includes a depletion region in the pixel region and includes a neutral region in the peripheral region.

17. The X-ray imaging element according to claim 15, wherein
the light-receiving elements are provided for the respective pixels, and
the light-receiving element comprises a p-n junction light-receiving element that applies a reverse bias between the one surface of the semiconductor substrate and another surface opposed to the one surface.

18. An electronic apparatus comprising an X-ray imaging element according to claim 15.

19. A light-receiving element comprising:
a semiconductor substrate including a photoelectric conversion region;
a first electrically-conductive region provided at an interface of one surface of the semiconductor substrate and coupled to a first electrode;
a second electrically-conductive region provided at the interface of the one surface and around the first electrically-conductive region and coupled to a second electrode; and
a third electrically-conductive region provided at the interface of the one surface and around the second electrically-conductive region and being in an electrically floating state, wherein
the semiconductor substrate further includes a fourth electrically-conductive region embedded and formed in the substrate, and
the first electrically-conductive region extends in a direction toward another surface opposed to the one surface, the first electrically-conductive region including, on a side closer to the other surface than the fourth electrically-conductive region, an overhanging section further extending in a horizontal direction.

20. A light-receiving element comprising:
a semiconductor substrate including a photoelectric conversion region;
a first electrically-conductive region provided at an interface of one surface of the semiconductor substrate and coupled to a first electrode;
a second electrically-conductive region provided at the interface of the one surface and around the first electrically-conductive region and coupled to a second electrode; and
a third electrically-conductive region provided at the interface of the one surface and around the second electrically-conductive region and being in an electrically floating state,
wherein
a plurality of the third electrically-conductive regions are formed around the second electrically-conductive region, and
an interval between the plurality of the third electrically-conductive regions formed around the second electrically-conductive region becomes wider stepwise as being outward.

* * * * *